United States Patent [19]

Keren

[11] Patent Number: 4,847,559

[45] Date of Patent: Jul. 11, 1989

[54] SPATIAL SEPARATION OF SPECTRAL COMPONENTS

[75] Inventor: Hanan Keren, Kfar Saba, Israel

[73] Assignee: Elscint Ltd., Haifa, Israel

[21] Appl. No.: 154,041

[22] Filed: Feb. 9, 1988

[30] Foreign Application Priority Data

Feb. 16, 1987 [IL] Israel .......................................... 81580

[51] Int. Cl.$^4$ ............................................. G01R 33/20
[52] U.S. Cl. ..................................... 324/307; 324/309
[58] Field of Search ............... 324/300, 307, 309, 311, 324/312; 128/653

[56] References Cited

U.S. PATENT DOCUMENTS

| 4,477,777 | 10/1984 | Gordon | 324/307 |
| 4,558,278 | 12/1985 | Young | 324/311 |
| 4,581,582 | 4/1986 | Redington | 324/309 |
| 4,585,992 | 4/1986 | Maudsley et al. | 324/309 |
| 4,585,993 | 4/1986 | Bottomley | 324/309 |
| 4,618,827 | 10/1986 | Redington et al. | 324/309 |
| 4,684,891 | 8/1987 | Feinberg | 324/307 |
| 4,701,708 | 10/1987 | Hardy et al. | 324/312 |
| 4,714,885 | 12/1987 | Paltiel et al. | 324/309 |
| 4,739,266 | 4/1988 | Kunz | 324/309 |

OTHER PUBLICATIONS

"Simple Protons Spectroscopic Imaging", By W. T. Dixon (153, 1984, pp. 189-1940).
"Chemical Shift Imaging: A Review by L. Brateman", American Journal of Radiology, vol. 146, pp. 971-980 (May 1986).

Primary Examiner—Michael J. Tokar
Attorney, Agent, or Firm—Sandler & Greenblum

[57] ABSTRACT

Spatial separation of first and second spectral components in magnetic resonance imaging systems is accomplished by causing the first and second spectral components to generate first and second signals of different frequencies which are spatially separated and converting the spatially separated signals to image data for first and second images of said first and second spectral components respectively.

20 Claims, 3 Drawing Sheets

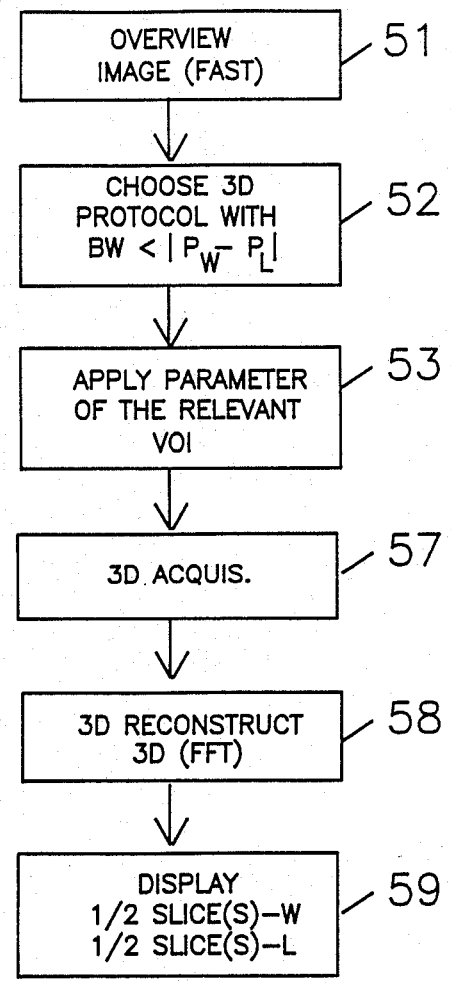
FIG. 4.
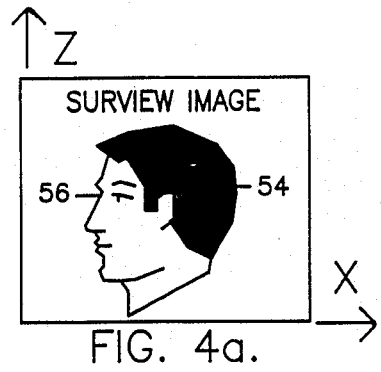
FIG. 4a.
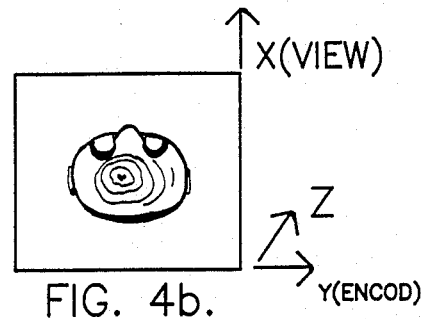
FIG. 4b.
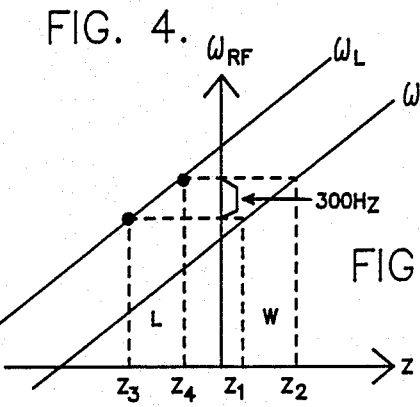
FIG. 5.
FIG. 6.

SPATIAL SEPARATION OF SPECTRAL COMPONENTS

FIELD OF THE INVENTION

This invention is concerned with magnetic resonance imaging (MRI) systems and more particularly with the use of such systems to provide separate images of different spectral components such as water and lipids in different sections of a sample using a single three dimensional scan. The single scan is configured to separate the spectral components spatially. This is another system and method for separating images of spectral components over and above the systems and methods described in two previously filed patent applications, one of which was filed in the United States on Aug. 4,1986, receiving Ser. No. 892,105 and which has now issued as U.S. Pat. No. 4,714,885 on Dec. 22, 1987, and the second of which was filed in United States on Nov. 25, 1987, having the Ser. No. 125,527. Both of these previous patent applications are assigned to the assignee of this invention.

BACKGROUND OF THE INVENTION

It is important to be able to remove certain spectral components from an image while leaving other spectral components. For example, in imaging of the eye by the usual magnetic resonance imaging (MRI) techniques, the optical nerve itself is covered by a layer of fat which obstructs the observation of the naked optical nerve. If the fat can be removed and just the water component of the image remains, then, a clear view is obtained of the optical nerve.

Also, at present, separate images of two different spectral components such as water and lipids within the patient are sometimes obtained. The separate images are important for diagnostic purposes; since, they supply the user with chemical information in addition to the morphological and anatomical information of conventional imaging.

Moreover by using an appropriate shift of one image in respect to the other, the two images can be combined in a manner which results in an image free of chemical shift artifacts. Presently, without taking proper steps, artifacts are caused by the different resonant frequencies of spectral components. For example hydrogen in fat has a different Larmor frequency than hydrogen in water. The Larmor frequency differences cause what are known as chemical shift artifacts.

A unique pair of inter-related sequences to obtain information on water and liquids in a patient was described in an article appearing in the journal Radiology entitled "Simple Protons Spectroscopic Imaging" by W. T. Dixon (0.153, 1984, PP189-194). In that article a method for encoding spectroscopic information and to produce clinical images is explained. The image produced differentiates between the water and fat intensities. The differentiation is done spectrally. The two mentioned patent applications are improvements on this method and also distinguish the water and fat components or in general spectral components spectrally. Disadvantages in the use of methods which spectrally differentiate between spectral components or chemically differentiated components are that a high degree of homogeneity of the field is required; or in the absence of the high degree of homogeneity, field maps are required showing the exact inhomogeneity of the magnetic field used during the test.

A review article entitled "Chemical Shift Imaging: A Review by L. Brateman" appeared in the American Journal of Radiology, volume 146, pp 971-980 (May 1986). It surveyed the prior art methods of chemical shift imaging which is defined in the article as "determining the spatial distribution of nuclei with a particular resonance frequency, such as water protons, rather than imaging the entire spectrum of resonance frequencies within a body".

Another method not directly related to the Dixon method is a chemical shift selection saturation method (see noted Brateman article and method 3). This too, however, requires a high degree of homogeneity or exact measurement of the imhomogeneity of the field in which the tests are conducted. The degree of homogeneity required has not been obtained in actual working systems. Phase mapping is time consuming and accordingly it is desirable to avoid the necessity of phase mapping and nonetheless, to provide data for separately imaging spectral components in the subjects being imaged.

BRIEF DESCRIPTION OF THE INVENTION

According to a broad aspect of the present invention, a method of using MRI systems for acquiring spatially separated image data contributions obtained from first and second spectral components during a single scan of selected portions of a sample is provided, said method comprising the steps of:
exciting the first and second spectral components to cause the first and second spectral components to generate first and second signals of different frequencies which are spatially separated, and
converting said spatially separated first and second signals to image data for first and second spatially, spectrally separated images.

According to another aspect of the present invention, a method of using MRI systems for aquiring spatially separated image data contributions derived from first and second spectral components, respectively during a single scan of selected portions of samples is provided, said image data being stored within a plurality of Z matrices having coordinate defined areas X,Y corresponding to spatially defined sections in selected X,Y, and Z volumes of the samples, said method comprising the steps of:

aquiring RF signals using a three dimensional scan sequence,
said acquiring step including: applying an encoding gradient along the volume select gradient axis during the three dimensional scan sequence,
using RF pulses in said three dimensional scan sequence wherein the bandwidth of the RF pulses is less than or equal to the Larmor frequency difference of the spectral components, and
using a three dimensional Fourier transform method for obtaining data from said RF signals for storage in said corresponding areas; said matrices each being spatially divided into X, Y defined areas containing only data of said first spectral components, X, Y defined areas containing only data of said second spectral components so that a fraction of the Z matrices contain only first spectral component data and the remaining Z matrices contain only second spectral component data.

Accordingly, the display from the acquired RF signals provides a display of first spectral components separated from the display of second spectral components. The RF signals are acquired in a single scan without being unduly effected by the homogeneity of the large static magnetic field of the MRI system.

In the past, to minimize or eliminate the chemical shift artifacts, it has been customary to use RF pulses during the scan sequence wherein the bandwidth of the pulses encompasses the resonant frequencies of both spectral components. The invention herein minimizes chemical shift artifacts by using radio frequency pulses having bandwidths that lie between the resonant frequencies of each of the spectral components to thereby excite the spectral components to generate non-overlapping RF signals. Subsequently, the spectral components are separated in a three dimensional scan sequence followed by a three dimensional fast Fourier transform operation.

A feature of the invention comprises combining the images of the individual spectral components to provide a combined image without chemical shift artifacts.

According to another feature of the invention the spectral components are water and lipids. The strength of the large static magnetic field is in the order of 2 Tesla whereby the bandwidth utilized is 300 Hz or less.

According to another feature of the invention, a first surview image is aquired and the volume of interest (VOI) is selected to have either a pure fat image or a pure water image. This can be done since the water and fat are spatially seperated (by pixels) rather than by frequency. After selecting the volumes of interest, then the 3—D aquisition and reconstruction are accomplished. In this manner the display, for example, of the eye is presented purely as a water image, so that the optical nerve is not covered by fat.

In different pathologies it is important to examine the fat content of the particular VOI under investigation. For example, in diagnosing fat infiltration of the liver it is important to look at the amount of fat in the liver. This can be done by selecting the protocol so that the image of the liver is within the water portion of the image. Then by reversing the view gradient or by moving the RF signal's resonant frequency, the fat portion of the liver is imaged. In that manner, one is able to determine the percentage amount of fat in the liver. A similiar situation arises with fats within muscles, in general, such as for example in the heart. In all such situations it is extremely important to be able to efficiently separate the water and fat portions of the image without extensive inhomogeneity maps or to combine separate fat and water images of the same sections of the body to obtain chemical shift artifact free images.

BRIEF DESCRIPTION OF THE DRAWINGS

The above mentioned and additional objects and features of the present invention can be best understood when considered in the light of the following description of a broad aspect of the invention taken in conjunction with the accompanying drawings, wherein:

FIG. 4 is a generalized flow diagram, showing the inventive method;

FIG. 5 shows a multiformat display of 16 images spatially divided between water and fat images, and FIG. 6 is a Radian versus Z axis position graph.

GENERAL DESCRIPTION

Figure 1:
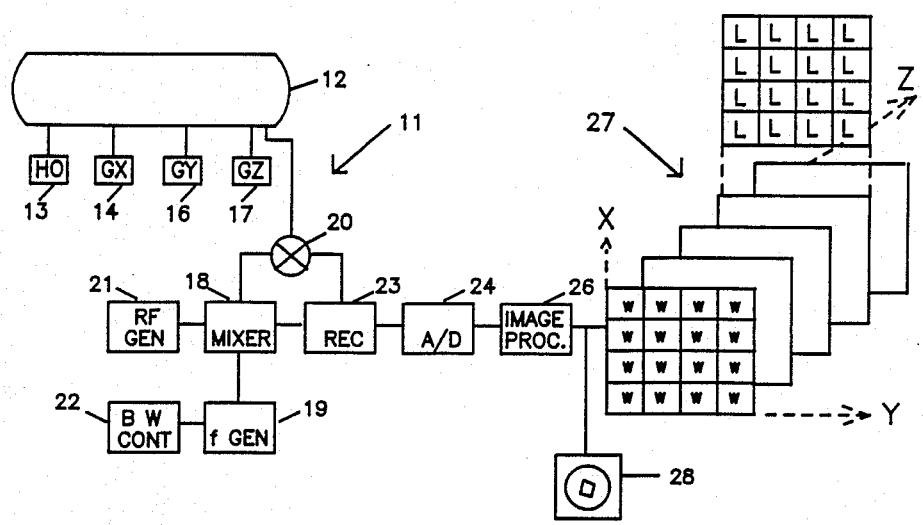
FIG. 1 is a typical MR data aquisition system including radio frequency pulse bandwidth controls.

The generalized MRI system 11 shown in FIG. 1 is used for providing images according to magnetic resonance principles. The system includes a large static magnet 12 into which the patient (or samples) are placed. A large static magnetic field can be generated using electromagnets, permanent magnets or super conductor magnets within the scope of this invention. In a preferred embodiment, a superconducting magnet is used. The energization of the superconducting magnet is indicated at 13 by magnetic field generating block Ho.

Means are provided for locating the source of RF signals received during imaging scan sequences. More particularly gradient fields are applied to the static magnetic field. These gradients are applied in the X, Y and Z co-ordinate directions. Gradient generators for applying such gradients are indicated at blocks 14, 16 and 17 labelled Gx, Gy and Gz, respectively. The gradients are used to vary the static magnetic field along X, Y and Z axes and thus provide slice selection, encoding and view selection functions which are well known in the magnetic resonance imaging art.

The large static magnetic field causes an alignment of certain nuclear spins in the sample (or patient). Means are provided subsequently for perturbing or tipping the aligned spins by applying RF pulses at the Larmor frequency of the particular nuclei being perturbed. The Larmor frequency is:

$$fo = \gamma Bo / 2\pi$$

where:
  $\gamma$ is the gyromagnetic constant for the isotope whose nuclei is perturbed,
  $\pi$ is the constant 3.1416+, and
  Bo is the strengh of the static magnetic field at the location of the nuclei.

The RF pulses are obtained from the mixer 18. The mixer in general "mixes" the frequencies obtained from a function generator 19 and an RF generator 21. In accordance with this invention, means such as bandwidth control circuit 22 are provided for varying the bandwidth of the RF pulses by manipulating the function generator output.

The RF pulse shaped by the function generator is sent through switch means 20 to an RF coil or probe, not shown, which subjects the aligned spins in the patient to the RF pulse and tips the spins. Free induction decay (FID) signals generated as a result of the tipped spins are received in the same RF probe or through a separate RF probe. The received signal also goes through switch 22 to a receiver 23. Analog to digital (A/D) converter unit 24 is provided for changing the analog signal obtained at receiver 23 to a digital signal. An image processor 26 subjects the digital data received from the A/D unit 24 to two three dimensional fast Fourier transformations (3DFFT). The two transformations change view signals and phase encoded signals along the slice encoded direction to spatially located signals in XY matrices, in a well known manner. The XY pixel locations are indicated at the plurality of matrices in the Z direction of block 27. The signal data and the location data comprise the image after the Fourier transformations. The image is then displayed on the display unit 28. Block 27 indicates that the image is broken into seperate water and fat portions along the Z direction.

Figure 2:
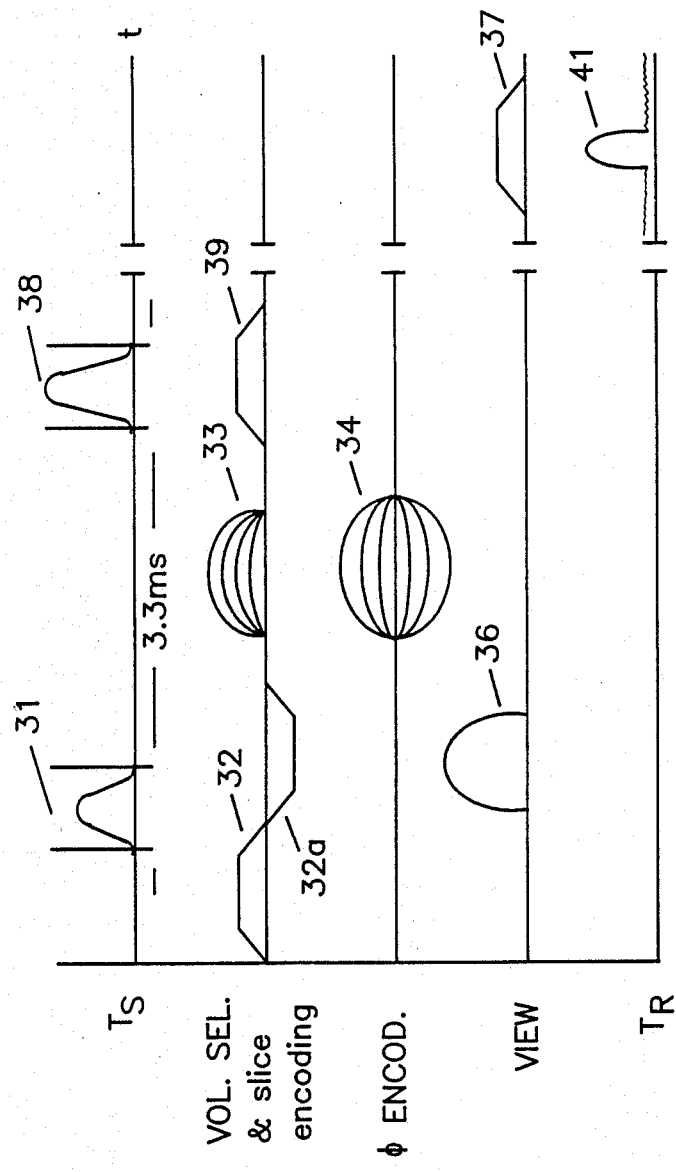
FIG. 2 is a generalized showing of a data aquisition sequence for use in the invention for obtaining the spatial separation of the spectral components.

As shown in FIG. 2, a modified three dimensional scan sequence is preferrably followed. The normal three dimensional scan sequence is modified by controlling the bandwidths of the transmitted RF pulses. The first 90 degree RF pulse indicated at 31 is transmitted during the simultaneous transmital of a volume select gradient pulse 32 which selects a volume of a patient being imaged. The normally used inverted portion 32a of pulse 32 is also shown.

Subsequent to the volume select gradient pulse, a volume encoding gradient pulse is transmitted as indicated at 33. At the same time as the transmittal of the volume select encoding pulse, a phase encoding pulse 34 is transmitted. The phase encoding pulse is at 90 degrees to the volume select encoding pulse. Orthogonal to both encoding pulses are the view selecting gradient pulses, shown as pulse 36 followed by a view selecting gradient pulse 37 designed to occur during the receipt of the echo signals.

Prior to the receipt of the echo signal, however, a second RF pulse, shown as 38, is transmitted. The second RF pulse is designed to move the tipped spins 180 degrees in the plane to which they were tipped. The RF pulse 38 is transmitted during the operation of a second volume select pulse 39. Both RF pulses are limited in bandwidth to be no more than the difference in Larmor times between the spectral components. In this example, (fat and water), the difference is 3.3 ms at the full width half maximum (FWHM) point of the RF pulses when the high static field is a two Tesla field. Under such conditions, the resonant points of the fat and water are separated by 3.5 parts per million. The Larmor frequency of hydrogen at two tesla is nominally 85 MHz. Accordingly the bandwidth is set so that in the frequency mode, the bandwidth is limited to no more than 300 Hz. The bandwidth is so limited, according to a preferred embodiment by varying the frequency mixed with the radio frequency; that is, the function which is used to shape the RF pulse is manipulated so that the RF pulse is limited to a bandwidth of 30 Hz in the frequency domain and 3.3 ms in the time domain.

At a delay time after the application of the 180 degree pulse, an FID echo signal, indicated at 41, is received. The receipt, of course, is during the application of the view gradient pulse 37. Subsequently, other echo signals 41 are received after the application of subsequent RF, phase encoding and volume encoding pulses.

Figure 3:
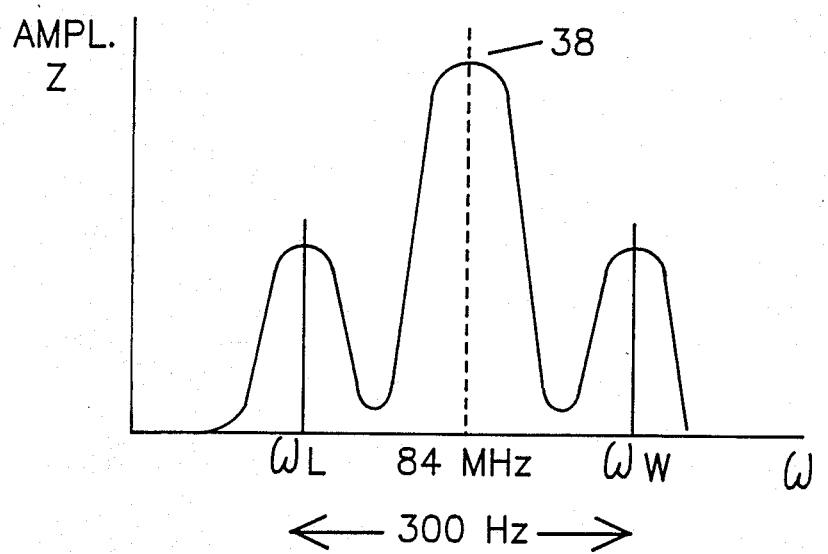
FIG. 3 is a showing of the resonant frequencies of water components and fat components along with the resonant frequency of the RF pulse used in the scan sequence of FIG. 2.

FIG. 3 shows an RF pulse 38 in the frequency domain. Therein the RF pulse 38 is shown as having a resonant frequency at 85 MHz. In this example, the static magnetic field is two Tesla. At this field strength the Larmor frequency of hydrogen in a water molecule and the Larmor frequency of hydrogen in a fat molecule are seperated by 300 Hz, as shown in FIG. 3. By limiting the band width of the RF pulse it is possible to obtain data seperately from the hydrogen in fat molecules and the hydrogen in water molecules. The data from the separated molecules is collected and is also spatially separated by the 300 Hz.

In the usual three dimensional fast Fourier transform operation, the wave data is converted to X and Y data along the Z axes. The X and Y data are either all water or all lipid as shown in FIG. 1 at 27, and are spatially separated in the Z direction based on the frequency separation. It is possible to reverse the seperation of water and fat. That is, so that the lipid will appear in the first matrices instead of water as 27, for example. As shown in FIG. 5, for example, the fat pixels can be reversed with the water pixels so that the fat pixels are the top pixels and the water pixels are the bottom pixels in the multiformat showing.

This reversal of water and fat, can be done in different ways. One method is by reversing the sign during the acquisition procedure 57 shown in FIG. 4.

FIG. 6 shows how the gradients "project" the bandwidths of the RF pulses to provide spatially separated water and lipid components. In FIG. 6 the bandwidth of the RF pulses are limited to assure that the water and lipid components do not overlap i.e. to 300 Hz in a 2 Tesla field. This is done to provide spatially separated water and lipid components. In essence the bandwidth $$\Delta f = B_o(\gamma_w - \gamma_L)/2\pi$$

where:
$\gamma$ is the gyro-magnetic constant,
$B_O$ is the main magnetic field strength, and
W,L, are subscripts indicating,
a proton in a water molecule, or a proton in a lipid molecule, respectively, and
$\pi$ is the contstant 31416+

In operation, it is preferred but not essential that first an overview image is obtained. The overview image, for example, is shown in FIG. 4a. The acquisition of the surview image is indicated at block 51. A 3-D acquistion protocol is then chosen wherein the bandwidth of the radio frequency pulses is less than or equal to the Larmor frequency of hydrogen in water molecule minus the Larmor frequency of hydrogen in fat molecules, as indicated at block 52. Block 53 indicates that parameters are selected to provide an image, indicated in FIG. 4b, of the relevant volume desired. As shown in FIGS. 4a and 4b, a section 54 of volume including the eyes 56 is selected, to eliminate the fat normally covering the optical nerve, for example. After the selection of the desired volume, the 3-D acquisition procedure is followed as indicated at block 57. After the data is acquired as indicated in block 57, reconstruction using 3-D fast Fourier transforms is done as indicated at block 58. Then the image is displayed as indicated at 59. The display, as indicated in FIG. 1, has a portion, i.e. half of its slices comprised of pure water data and half of its slices comprised of pure fat data. The selection is made so that the pure water portion of the image data covers the optical nerve section of the selected volume of the overview. This acquisition method enables a multiformat display of water and lipid image as shown at FIG. 5. Therein 16 images are shown, 8 of water data and 8 of lipid data.

If it is decided to reverse the image and show only the fat portion without the water portion then, for example, the sign of the viewing gradient is changed. Simple processing can be used to combine both the water and fat by running a regular 3-D image sequence without limiting the bandwidth; wherein water and fat data are combined in the usual manner. In that case the bandwidth is made broad enough to encompass both the water and fat portions in the usual manner. Then the fat or water can be subtracted from the total image to minimize the chemical shift artifact. Alternatively and preferrably the total image is obtained by reversing the fat and water to obtain fat and water components for the full image. The full image is then obtained by combining the component images to obtain an artifact free image.

Accordingly, a method is provided wherein water and fat are spatially seperated using a regular three dimensional aquisition and reconstruction sequence without being limited by the precise homogeneity of the large static magnetic field.

The invention is described with regard to specific examples. It should be understood that these examples are not given as limitations on the scope of the invention but as exemplary embodiments of the invention. The invention itself is defined by the accompanying claims.

What is claimed is:

1. A method for separating first and second spectral components in magnetic resonance imaging (MRI) systems, said method comprising the steps of:

using a three dimensional (3-D) scan sequence where the third dimension is in a slice selecting direction derived from applying slice selecting encoding gradient pulses;

limiting the bandwidth of the applied radio frequency (RF) pulses in the 3-D scan sequence to acquire RF signals from the spectral components that are separated in the slice selecting direction; and using a 3-D fast Fourier transform operation for transforming the acquired separated RF signals into image values that are separated in the slice selecting direction to provide images of slices that are exclusively of said first spectral component and images of slices that are exclusively of said second spectral component.

2. The method of claim 1 wherein the step of limiting the bandwidths provides bandwidths that are limited to approximately the difference between the Larmor frequencies of the spectral components.

3. The method of claim 2 wherein said images comprise rows and columns of pixels and wherein the step of limiting provides bandwidths limited so that the RF signals from the spectral components are slightly overlapped to also provide an image of a slice having at least a row containing a first spectral component with the rest of the rows being said second component exclusively.

4. The method of claim 2 wherein the step of limiting the bandwidths provides limits so that the RF signals from the spectral components abut each other.

5. The method of claim 2 wherein said images comprise rows and columns of pixels and wherein the step of limiting the bandwidth of the applied RF pulses provides signals from the spectral components that are spatially separated from each other to also provide an image of at least one slice containing at least one row of pixels having data from both said first and said second spectral components.

6. A method for separating spectral components in magnetic resonance imaging (MRI) systems, said method including the steps of:

using a three dimensional (3-D) spin echo scan sequence, where the first dimension is a frequency direction derived by applying a frequency encoding gradient, the second dimension is a phase direction derived by applying phase encoding gradients and the third dimension is a slice selecting direction derived by applying slice selecting encoding gradients, exciting the first and second spectral components to cause the first and second spectral components to generate first and second radio frequency (RF) signals of different frequencies which are spatially separated in the slice selecting direction to provide a plurality of slices that are exclusively either of one or the other of said first and second spectral components.

7. The method of claim 6 wherein said step of exciting includes applying RF pulses having limited bandwidths.

8. The method of claim 7 wherein the acquired image data contributions are derived from first and second spectral components respectively during a single scan, and storing said image data on a plurality of Z matrices having X and Y co-ordinate defined areas.

9. The method of claim 7 wherein said spectral components are water and lipids and said bandwidth is 300 Hz.

10. A system for separating first and second spectral components in magnetic resonance imaging (MRI) systems, comprising:

means for performing a three dimensional (3-D) spin echo sequence where the third dimension is in a slice selecting direction, said means for performing the 3-D spin echo scan sequence including means for applying a different slice selecting encoding pulse for each slice to be acquired, means for limiting the bandwidth of applied radio frequency (RF) pulses in the 3-D spin echo scan sequence to acquire RF signals from the spectral components that are separated in the slice selecting direction to provide images of slices that are exclusively of said first spectral component and images of slices that are exclusively of said second spectral component;

said applied RF pulses having a frequency centered at substantially the frequency mid-way between the Larmor frequency of each of said first and second spectral components; and means for doing a 3-D fast Fourier transform operation for transforming the acquired separated RF signals into the separated images.

11. The system of claim 10 wherein the means for limiting the bandwidths limit the bandwidths to approximately the difference between the Larmor frequencies of the spectral components.

12. The system of claim 11 wherein the means for limiting the bandwidths provide bandwidths that are limited so that the RF signals from the spectral components slightly overlap.

13. The system of claim 11 wherin the means for limiting the bandwidths limit the bandwidths so that the signals from the two spectral components abut each other.

14. The system of claim 11 wherein the means limiting the bandwidths of the applied RF pulses provides signals from the spectral components that are spatially separated from each other.

15. The system of claim 14 including means for converting the spatially separated signals into display images.

16. A system separating first and second spectral components in magnetic resonance imaging (MRI) systems, said MRI systems having a main static magnetic field along the Z axis of an X,Y,Z Cartesian coordinate system, said system for separating said first and second spectral components including:

means for exciting the first and second spectral components to cause the first and second spectral components to generate first and second radio frequency (RF) signals of different frequencies which are spatially separated on XY planes along the Z axis;

said means for exciting comprising means for applying RF pulses each having a peak frequency centered substantially mid-way between the different Larmor frequencies of the first and second spectral components and having limited bandwidths;

means for acquiring image data contributions derived from the first and second spectral components, respectively, during a single scan, and means for storing said image data on a plurality of Z matrixes extending along the Z axis having X and Y co-ordinate defined areas.

17. The method of claim 16 wherein the acquiring step includes applying an encoding gradient along a volume select gradient axis during a three dimensional scan sequence, using RF pulses in said three dimensional scan sequence wherein the bandwidth of the RF pulses is limited to be less than or equal to the Larmor frequency difference of the spectral components in the system, and using a three dimensional Fourier transform method for obtaining data from said RF signals for storage in a plurality of Z matrices, said matrices being spatially divided into X and Y defined areas containing only data of said first spectral component, and X and Y areas containing only data of said second spectral components so that a portion of the Z matrices contain only first spectral component data and the remaining Z matrices contain only second spectral component data.

18. The method of claim 17 including combining the images of the individual spectral components to provide a combined image without chemical shift artifacts.

19. The system of claim 16 wherein the means for acquiring includes means for applying encoding gradient pulses along a volume select gradient axis during a three dimensional scan sequence, means for using RF pulses in said three dimensional scan sequence wherein the bandwidth of the RF pulses is limited to be less than or equal to the Larmor frequency difference of the spectral components in the system, and means for applying a three dimensional Fourier transform for obtaining data from said RF signals for storage in said plurality of Z matrices, said Z matrices being spatially divided in the Z direction into a first plurality of sequential Z matrices containing only data of said first spectral component, a second plurality of sequential Z matrices containing only data of said second spectral component so that a portion of the plurality of Z matrices contain only first spectral component data and another portion of the Z matrices contain only second spectral component data.

20. The system of claim 19 including means for combining the images of the individual spectral components to provide a combined image without chemical shift artifacts.

* * * * *